United States Patent
Shin et al.

(10) Patent No.: US 12,372,862 B2
(45) Date of Patent: Jul. 29, 2025

(54) RETICLE HAVING HEXAGONAL PATTERNS IN A HONEYCOMB ARRANGEMENT

(71) Applicant: SAMSUNG ELECTRONICS CO., LTD., Suwon-si (KR)

(72) Inventors: Soeun Shin, Seongnam-si (KR); Jin Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 17/824,151

(22) Filed: May 25, 2022

(65) Prior Publication Data

US 2023/0065721 A1    Mar. 2, 2023

(30) Foreign Application Priority Data

Sep. 1, 2021  (KR) .................. 10-2021-0116337

(51) Int. Cl.
  *G03F 1/24*    (2012.01)
  *H01L 21/311*    (2006.01)
  *H10B 12/00*    (2023.01)
  *H10N 50/01*    (2023.01)

(52) U.S. Cl.
  CPC .......... *G03F 1/24* (2013.01); *H01L 21/31144* (2013.01); *H10B 12/033* (2023.02); *H10N 50/01* (2023.02)

(58) Field of Classification Search
  CPC .................. G03F 1/24; H10B 12/033
  See application file for complete search history.

(56) References Cited

U.S. PATENT DOCUMENTS

| | | | |
|---|---|---|---|
| 9,195,130 B2 | 11/2015 | Yamada et al. | |
| 9,519,220 B2 | 12/2016 | Lee et al. | |
| 9,548,274 B1* | 1/2017 | Yu ........................ | H01L 21/268 |
| 9,958,770 B2 | 5/2018 | Ahn et al. | |
| 10,852,633 B2 | 12/2020 | Oosterhoff et al. | |
| 10,859,901 B2 | 12/2020 | Nam et al. | |
| 10,996,556 B2 | 5/2021 | Lee et al. | |
| 2005/0074682 A1* | 4/2005 | Noda ........................ | G03F 1/36 |
| | | | 430/30 |
| 2008/0248408 A1* | 10/2008 | MacDonald ............... | G03F 1/00 |
| | | | 430/5 |
| 2012/0045714 A1* | 2/2012 | Akiyama .................. | G03F 1/64 |
| | | | 430/5 |
| 2012/0221985 A1* | 8/2012 | Fujimura ............ | H01J 37/3174 |
| | | | 716/55 |
| 2013/0140265 A1 | 6/2013 | Kim et al. | |
| 2015/0255649 A1* | 9/2015 | Kim .................... | H01L 21/0262 |
| | | | 257/190 |
| 2017/0131638 A1* | 5/2017 | Kim ........................ | G03F 1/62 |
| 2021/0116802 A1* | 4/2021 | Lee ........................ | G03F 1/64 |
| 2022/0326628 A1* | 10/2022 | Chen .................. | G03F 7/70875 |

\* cited by examiner

*Primary Examiner* — Michael Jung
(74) *Attorney, Agent, or Firm* — Muir Patent Law, PLLC

(57) ABSTRACT

A reticle includes a mask substrate, a reflective layer on the mask substrate, and a mask pattern on the reflective layer, the mask pattern having image patterns to absorb light, and first patterns between the image patterns, the first patterns being openings, the first patterns having a honeycomb arrangement, in a plan view, such that seven of the first patterns are arranged at corresponding vertices and a center of a first regular hexagon, and each of the first patterns having a shape of a second regular hexagon that is rotated by 90 degrees relative to the first regular hexagon.

10 Claims, 22 Drawing Sheets

RETICLE HAVING HEXAGONAL PATTERNS IN A HONEYCOMB ARRANGEMENT

CROSS-REFERENCE TO RELATED APPLICATION

This application claims priority under 35 USC § 119 to Korean Patent Application No. 10-2021-0116337, filed on Sep. 1, 2021, in the Korean Intellectual Property Office (KIPO), the contents of which are incorporated by reference herein in their entirety.

BACKGROUND

1. Field

Example embodiments relate to a reticle used in a photo process and a method for forming patterns in a semiconductor device using the same. More particularly, example embodiments relate to a reticle suitable for forming a hole array pattern having a honeycomb arrangement and a method for forming the hole array pattern using the same.

2. Description of the Related Art

A semiconductor device may include densely repeated holes and/or patterns. As the semiconductor device is highly integrated, it may not be easy to form the holes and patterns. Therefore, it is needed to optimize photo processes for forming the holes and patterns.

SUMMARY

According to example embodiments, there is provided a reticle. The reticle may include a mask substrate, a reflective layer on the mask substrate, and a mask pattern on the reflective layer. The mask pattern may include image patterns for absorbing light and first patterns serving as openings between the image patterns. In a plan view, the first patterns may have a honeycomb arrangement which is arranged at each vertex of a first regular hexagon and an inner center of the first regular hexagon. Each of the first patterns has a shape of a second regular hexagon in which the first regular hexagon is rotated by 90 degrees.

According to example embodiments, there is provided a reticle. The reticle may include a mask substrate including an image region and a black region surrounding the image region, a metal layer on a bottom surface of the mask substrate, a reflective layer on the mask substrate, and a mask pattern on the reflective layer. In the mask pattern, image patterns for absorbing light and first patterns serving as openings between the image patterns may be disposed on the image region. A black pattern may be disposed on the black region. In a plan view, the first patterns may have a honeycomb arrangement which is arranged at each vertex of a first regular hexagon and an inner center of the first regular hexagon. Each of the first patterns has a shape of a second regular hexagon. The second regular hexagon may circumscribe each of target holes of a target hole array.

According to example embodiments, there is provided a method for forming a pattern in a semiconductor device. In the method, a mold layer may be formed on the substrate. A hard mask layer may be formed on the mold layer. A photoresist layer may be formed on the hard mask layer. A photo process may be performed using a reticle on the substrate on which the photoresist layer is formed to form a photoresist pattern including holes having a honeycomb arrangement which is arranged at each vertex of a first regular hexagon and an inner center of the first regular hexagon. The hard mask layer may be etched using the photoresist pattern to form a hard mask. The mold layer may be etched using the hard mask to form a hole array pattern including holes having the honeycomb arrangement. The reticle may include image patterns for absorbing light and first patterns serving as openings between the image patterns. In a plan view, the first patterns may be positioned to have the honeycomb arrangement, and the first patterns may have a shape of a second regular hexagon in which the first regular hexagon is rotated by 90 degrees.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
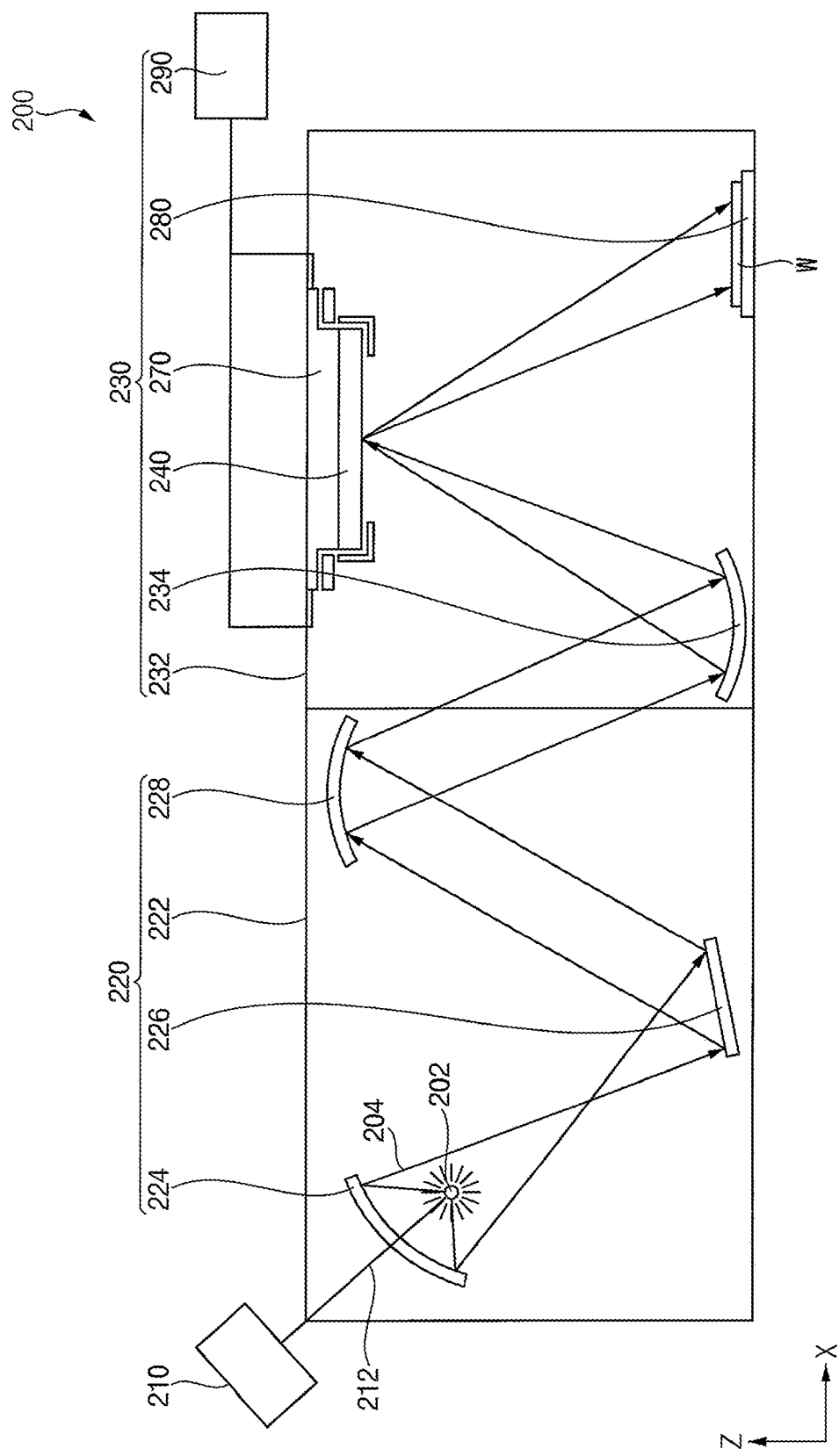
FIG. 1 is an exposure apparatus in accordance with example embodiments.

FIG. 1 is an example of an exposure apparatus in accordance with example embodiments. The exposure apparatus may be an extreme ultraviolet (EUV) exposure apparatus.

Referring to FIG. 1, an exposure apparatus 200, according to example embodiments, may include a pumping light source 210, an illumination part 220, and a projection part 230. The projection part 230 may include an air supply part 290.

The pumping light source 210, e.g., a laser source, may generate pump light 212. The pumping light source 210 may provide the pump light 212 to the illumination part 220. For example, the pump light 212 may include a laser beam. The pump light 212 may have a single wavelength of about 400 nm to about 800 nm.

The illumination part 220 may generate EUV light 204. The EUV light 204 may be generated from an EUV source 202. The EUV light 204 may also be referred to as EUV plasma or EUV laser beam. The EUV light 204 may be guided to a substrate W through the projection part 230. In example embodiments, the illumination part 220 may include a source housing 222, a collector mirror 224, a facet field mirror 226, and a facet pupil mirror 228. The source housing 222 may surround, e.g., contain, the collector mirror 224, the facet field mirror 226, the facet pupil mirror 228, and a source blocking part.

The EUV source 202 may be filled in the source housing 222. The pump light 212 may pass through the source housing 222 and the collector mirror 224. The EUV source 202 may be excited by the pump light 212. In example embodiments, the EUV source 202 may include, e.g., tin (Sn), xenon (Xe) gas, titanium (Ti), or lithium (Li) vapor in a plasma state. For example, the EUV source 202 of tin may generate the EUV light 204 of about 13.5 nm wavelength. The collector mirror 224 may reflect the EUV light 204 to the facet field mirror 226. The EUV light 204 may be focused on the facet field mirror 226. The facet field mirror 226 may reflect the EUV light 204 to the facet pupil mirror 228. The facet field mirror 226 may include a flat mirror. The EUV light 204 between the facet field mirror 226 and the facet pupil mirror 228 may be illuminated, e.g., transmitted or passed, in parallel. The facet pupil mirror 228 may include a concave mirror. The EUV light 204 may be focused on the projection part 230 by the facet pupil mirror 228. The EUV light 204 may pass through the source housing 222.

The projection part 230 may project the EUV light 204 to the substrate W. In example embodiments, the projection part 230 may include a chamber 232, a condensing mirror 234, a reticle 240, an electrostatic chuck 270, a stage 280, and the air supply part 290. The chamber 232 may be coupled to the source housing 222. Alternatively, the chamber 232 may be separated from the source housing 222. The chamber 232 may surround, e.g., contain, the condensing mirror 234, the reticle 240, the electrostatic chuck 270, and the stage 280. The chamber 232 may prevent contamination by particles of the condensing mirror 234, the reticle 240, the electrostatic chuck 270, and the stage 280. The condensing mirror 234 may be disposed at a lower portion of the chamber 232. The condensing mirror 234 may reflect the EUV light 204 to the reticle 240. The reticle 240 may be disposed at an upper portion of the chamber 232, e.g., the reticle 240 and the condensing mirror 234 may be at opposite sides of the chamber 232 along a vertical direction Z. The reticle 240 may project image patterns onto the substrate W. The image patterns may be transferred to the substrate W.

The electrostatic chuck 270 may fix the reticle 240 at the upper portion of the chamber 232. The reticle 240 may be fixed by an electrostatic force of the electrostatic chuck 270.

The stage 280 may be disposed at the lower portion of the chamber 232, e.g., the stage 280 and condensing mirror 234 may be on a same surface of the chamber 232. The stage 280 may load, e.g., hold, the substrate W on which the photoresist layer is formed.

The air supply part 290 may be connected to the electrostatic chuck 270 in the chamber 232. The air supply part 290 may supply air to the reticle 240 through the electrostatic chuck 270. The air may remove particles from the reticle 240.

An exposure process may be performed on the photoresist layer using the exposure apparatus 200. The exposure process may be performed, and a developing process may be performed to form a photoresist pattern. Underlying layers may be etched using the photoresist pattern to form target patterns or target holes.

Figure 2:
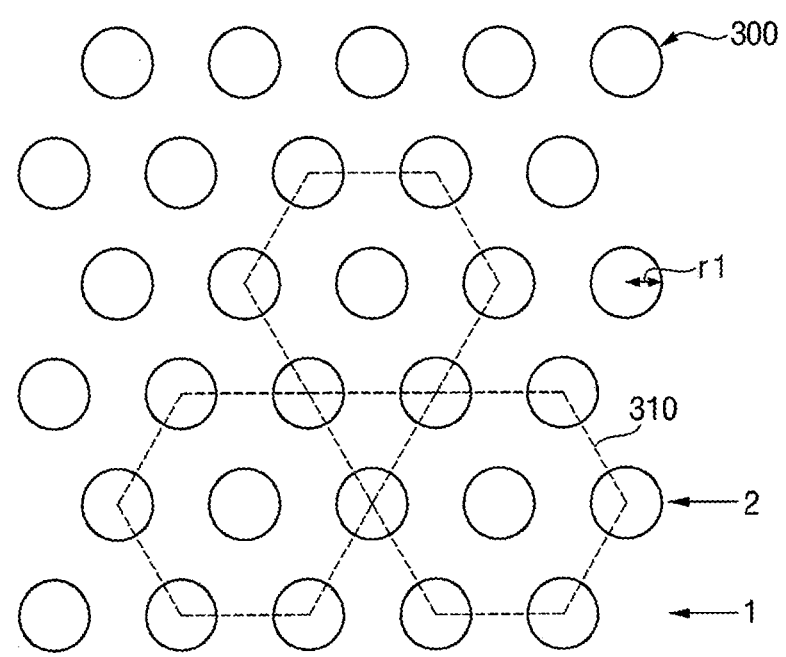
FIG. 2 is a plan view illustrating an arrangement of a target hole array pattern in accordance with example embodiments.
Figure 3:
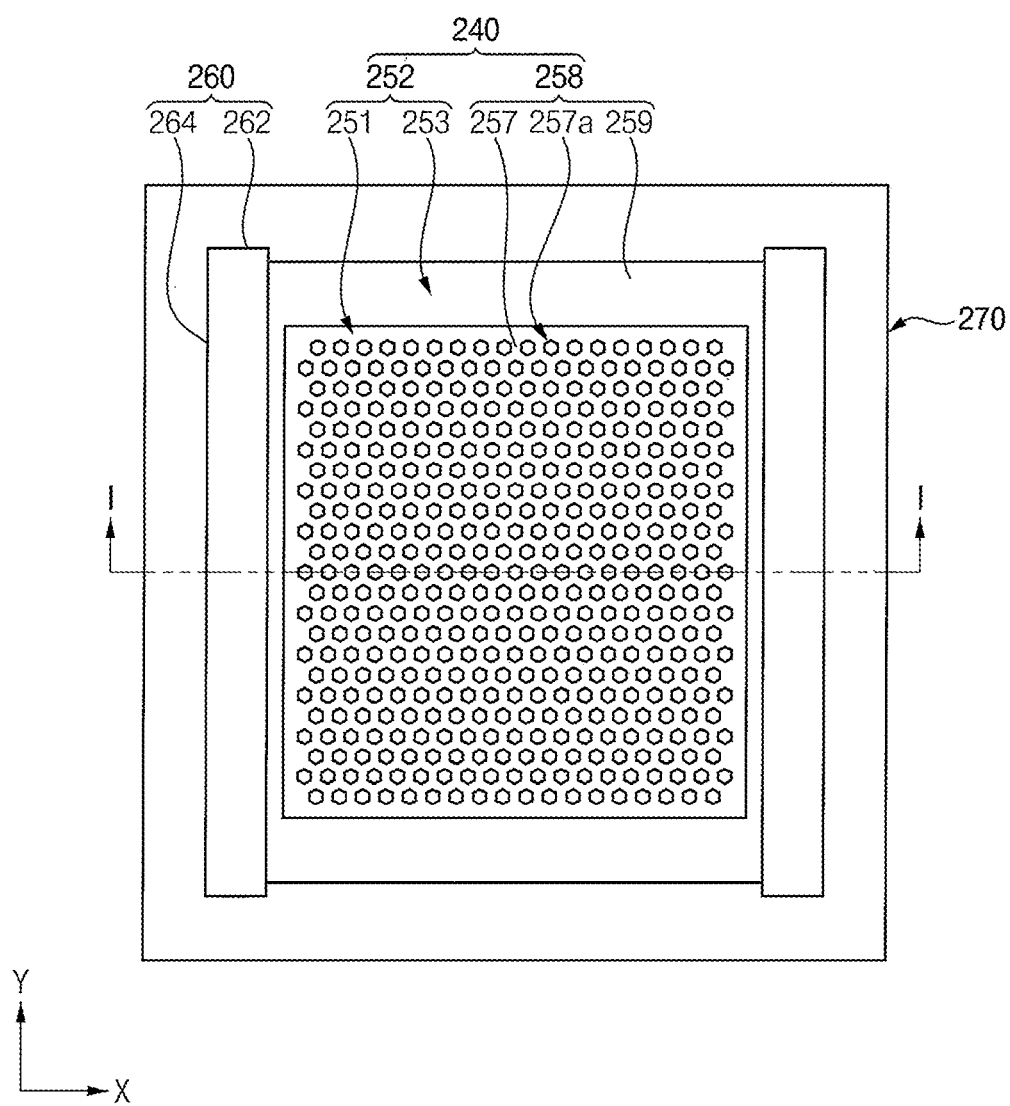
FIG. 3 is a plan view illustrating a reticle suitable for forming the target hole array pattern shown in FIG. 2.
Figure 4:
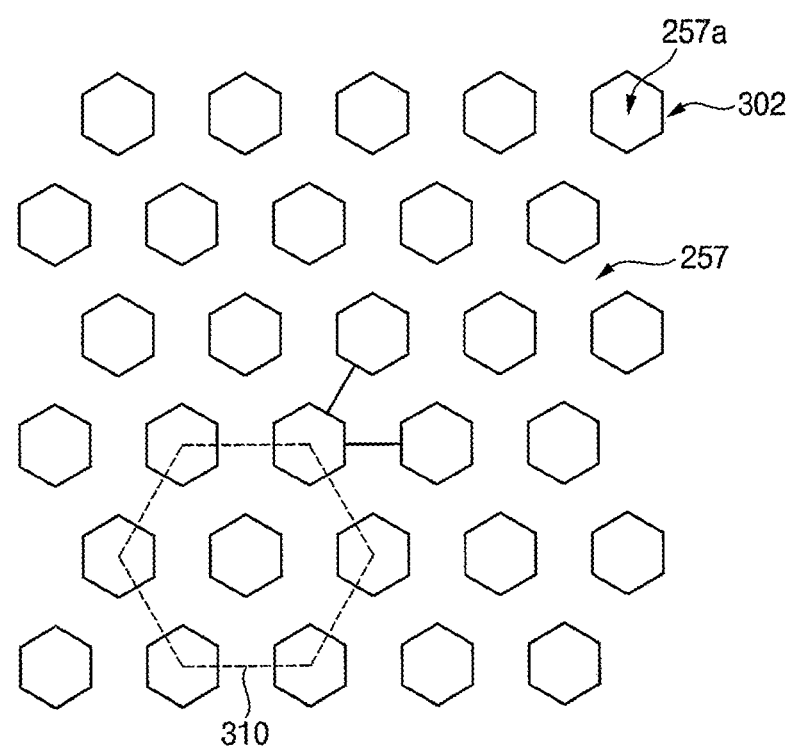
FIG. 4 is an enlarged plan view illustrating image patterns included in the reticle of FIG. 3.
Figure 4:
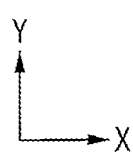
Figure 5:
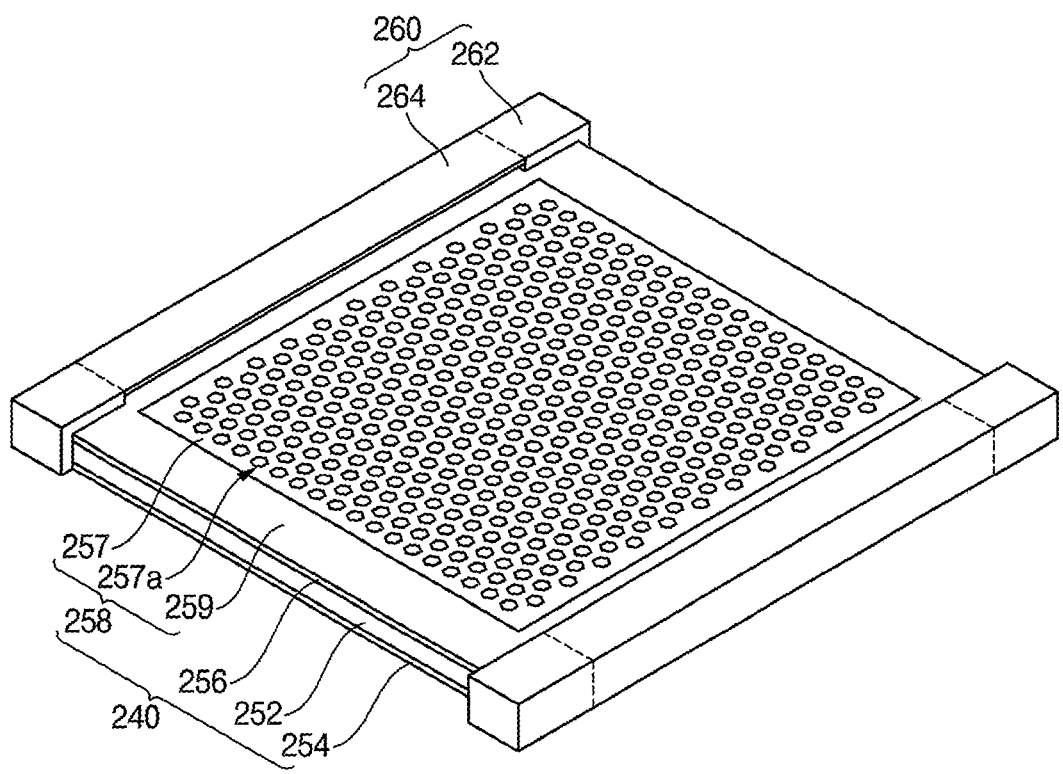
FIG. 5 is a perspective view of the reticle of FIG. 3.
Figure 6:
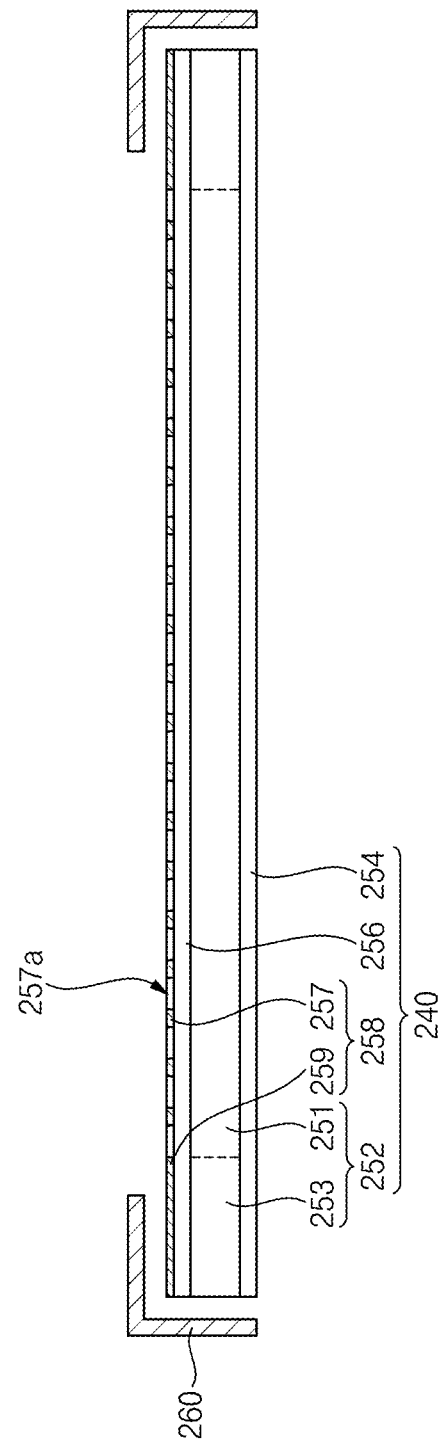
FIG. 6 is a cross-sectional view taken along line I-I' of FIG. 3.
Figure 7:
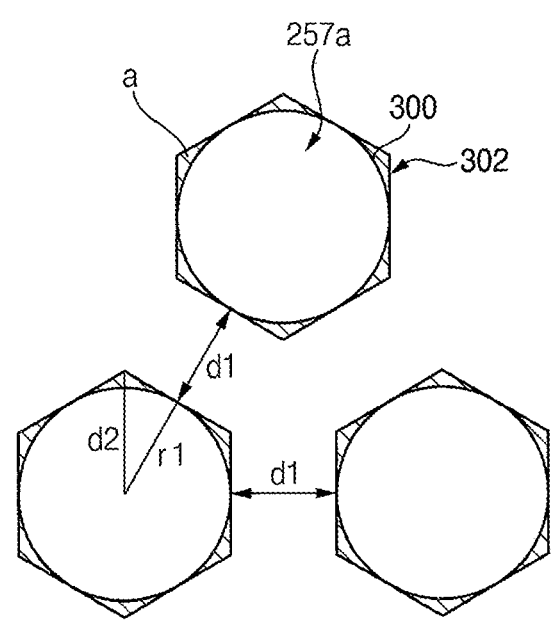
FIG. 7 is an enlarged plan view illustrating a first pattern of the reticle and corresponding target holes.

FIG. 2 is a plan view illustrating an arrangement of a target hole array pattern in accordance with example embodiments. FIG. 3 is a plan view of the reticle 240 for forming the target hole array pattern shown in FIG. 2. FIG. 4 is an enlarged plan view illustrating image patterns included in the reticle 240. FIG. 5 is a perspective view of the reticle 240. FIG. 6 is a cross-sectional view taken along line I-I' of FIG. 3. FIG. 7 is an enlarged plan view illustrating a first pattern of the reticle 240 and corresponding target holes. FIGS. 3, 5 and 6 further include an edge cover unit, and FIG. 3 further includes the electrostatic chuck 270.

Referring to FIG. 2, a mold layer may be formed on a substrate, e.g., substrate W. The mold layer may include regularly arranged holes 300. The holes 300 may be target holes, and the holes 300 may be referred to as a target hole array pattern. In a plan view, the holes 300 may have a honeycomb arrangement which is arranged at each vertex of a first regular hexagon 310 and an inner center of the first regular hexagon 310, e.g., the holes 300 may be arranged to have six holes 300 at respective six vertices of the first regular hexagon 310 with a seventh hole 300 at the center of the first regular hexagon 310. In the plan view, the holes 300 may have a circular shape, e.g., each of the holes 300 may have a circular shape.

In example embodiments, in the honeycomb arrangement of the holes 300, the first regular hexagon 310 may have a shape in which upper and lower portions have horizontal straight lines (e.g., along the first direction X), and a shape in which side portions protrude (e.g., each side portion may include two sides at an oblique angle with respect to each other and connecting the upper and lower portions). The holes 300 may be arranged in the first direction X parallel to the substrate. In addition, each of portions extending in the first direction X may be referred to as a row, and a plurality of rows may be arranged in a second direction parallel to the substrate and perpendicular to the first direction, e.g., the rows may be spaced apart from each other in the second direction Y. The holes disposed at the first row 1 and the holes disposed at the second row 2 adjacent to the first row 1 may be arranged from each other in a zigzag fashion, e.g., the first row 1 and the second row 2 may be offset from each other. That is, the holes 300 may be disposed in the zigzag fashion, e.g., zigzag pattern, in the second direction Y. Each of the holes 300 may have a first radius (i.e., a radius r1).

Hereinafter, the reticle 240 (for forming the target hole array pattern shown in FIG. 2) will be described hereinafter with reference to FIGS. 3 to 7.

Referring to FIGS. 3 to 7, the reticle 240 may be disposed on the electrostatic chuck 270. For example, the reticle 240 may be fixed on a lower surface of the electrostatic chuck 270, e.g., the reticle 240 may be fixed on a surface of the electrostatic chuck 270 that faces the interior of the chamber 232 and the stage 280 (FIG. 1). For example, each of the reticle 240 and the electrostatic chuck 270 may have a quadrangular, e.g., square, shape. A size, e.g., a width along the first direction X and/or the second direction Y, of the electrostatic chuck 270 may be greater than a size, e.g., a width along the first direction X and/or the second direction Y of the reticle 240, as illustrated in FIG. 3.

In example embodiments, edge cover units 260 may be mounted on the reticle 240, e.g., along opposite edges of the reticle 240. The reticle 240 may be disposed on a center of the electrostatic chuck 270.

In example embodiments, as illustrated in FIGS. 5 and 6, the reticle 240 may include a mask substrate 252, a metal layer 254, a reflective layer 256, and mask patterns 258. The mask substrate 252 may be between the metal layer 254 and the reflective layer 256, with the mask patterns 258 on the reflective layer.

In detail, the mask substrate 252 may include a low thermal expansion material (LTEM). The metal layer 254 may be disposed under the mask substrate 252. The reflective layer 256 may be disposed on the mask substrate 252, e.g., so the mask substrate 252 may be between the metal layer 254 and the reflective layer 256. The reflective layer 256 may reflect EUV light 204. For example, the reflective layer 256 may include molybdenum layers and silicon layers. The molybdenum layers and the silicon layers may be alternately stacked. For example, each of the molybdenum layers and the silicon layers may have a thickness equal to half the wavelength of the EUV light 204.

The mask patterns 258 may be disposed on the reflective layer 256, e.g., so the reflective layer 256 may be between the mask substrate 252 and the mask patterns 258. The mask patterns 258 may absorb EUV light 204. In example embodiments, the mask patterns 258 may include an image pattern 257 and a black pattern 259. The image pattern 257 may be disposed on the center of the mask substrate 252. The black pattern 259 may be disposed on the edge of the mask substrate 252. For example, the image pattern 257 and the black pattern 259 may include TaN or TaBN. In another example embodiments, the image pattern 257 and the black pattern 259 may include molybdenum, palladium, zirconium, nickel silicide, titanium, titanium nitride, chromium, chromium oxide, aluminum oxide, aluminum-copper alloy, or the like.

The image pattern 257 may be provided for imaging of circuit patterns. The EUV light 204 may be absorbed at the image pattern 257. The EUV light 204 may be transmitted through opening portions between the image patterns 257, and reflected by the reflective layer 256. Hereinafter, each of the opening portions between the image patterns 257 is referred to as a first pattern 257a.

In example embodiments, the mask substrate 252 may include an image region 251 and a black region 253. The image region 251 may be disposed at the center of the mask substrate 252, and the black region 253 may be disposed at the edge of the mask substrate 252, e.g., the black region 253 may surround an entire perimeter of the image region 251. The image patterns 257 and the first pattern 257a may be disposed on the image region 251. For example, the image region 251 may have a square shape. The black pattern 259 may be disposed on the black region 253. In example embodiments, the black region 253 may have a rectangular ring shape surrounding the image region 251. At least a portion of the EUV light 204 may be reflected in the image region 251, while the EUV light 204 may be absorbed in the black region 253.

The edge cover units 260 may be disposed on opposite side edges of the reticle 240. The edge cover units 260 may be disposed on the black region 253, e.g., the edge cover units 260 may overlap only the black region 253 among the black region 253 and the image region 251. The edge cover units 260 may include first portions 262 positioned on a corner of the reticle 240, and a second portion 264 positioned along an edge of the reticle 240.

The image patterns 257 of the reticle 240 will be described in more detail with reference to FIG. 4. The image pattern 257 may be an unexposed area, and the first pattern 257a between the image patterns 257 may be an exposed area.

Referring to FIG. 4, each of the first patterns 257a included in the reticle may have a shape of a second regular hexagon 302, in a plan view. As further illustrated in FIG. 4, six first patterns 257a may be arranged into a hexagon, with a seventh first pattern 257a in the center of the hexagon. The second regular hexagons 302 may have the same shape as that of the first regular hexagon 310, which is the honeycomb arrangement of the target hole array pattern, rotated by 90 degrees. That is, in the reticle 240, the first regular hexagon 310 includes upper and lower portions that extend horizontally in a straight line along the first direction X (dashed shape illustrated in FIG. 4), while the second regular hexagon 302 includes side portions that extend vertically in a straight line, e.g., along the second direction Y, while the upper and lower portions are protruding portions, e.g., non-straight portions including an angled protrusion protruding outwardly from the hexagon.

The first patterns 257a may be arranged in the first direction X parallel to the substrate, and the first patterns 257a may be arranged in a zigzag fashion in the second direction Y. That is, rows of the first patterns 257a in the first direction X may be offset with respect to each other along the second direction Y.

As shown in FIG. 7, the second regular hexagon 302 may circumscribe target holes 300 of the target hole array pattern, e.g., each of the target holes 300 may be inscribed in a corresponding one of the regular hexagons 302. A distance d2 from a center of the second regular hexagon 302 to the vertex of the second regular hexagon 302 may be greater than the first radius r1. A vertical distance from the center of the second regular hexagon 302 to each of sides of the second regular hexagon 302 may be substantially equal to the first radius r1. In addition, a shortest distance d1 between the second regular hexagons 302 disposed closest to each other, e.g., between two adjacent second regular hexagons 302 in the first direction X, may be substantially the same as a shortest distance between the target holes 300.

When an exposure process is performed on the photoresist layer on the substrate using the reticle 240, photoresist patterns including holes may be formed. In this case, each of the holes may have a circular shape, in a plan view. For example, shapes and sizes of the holes may be substantially the same as shapes and sizes of the target holes 300. Each of the holes may have the first radius r1.

As such, in the first patterns 257a of the reticle 240, the distance d2 from the center of the second regular hexagon 302 to the vertex of the second regular hexagon 302 may be greater than the first radius r1 of the target hole 300. Therefore, an area of the first pattern 257a of the reticle 240 may be greater than an area of the target hole 300. That is, in FIG. 7, the area of the first pattern 257a may be greater than the area of the target hole 300 by a hatched portion 'a' of an outside the target hole 300. Therefore, when the reticle 240 is used, the amount of light reflected through the first patterns 257a may be increased. Thus, a photoresist pattern may be accurately formed by the exposure process.

If each of first patterns included in a reticle were to have a circular shape having a radius of r (rather than having a hexagonal shape as in the example embodiments), an area of each of such first patterns would have been $\pi r^2$. In contrast, according to the example embodiments, when each of the first patterns 257a included in the reticle 240 has the regular hexagon circumscribed in a circle with the radius r, the area of each of the first patterns 257a is $2\sqrt{3}r^2$, i.e., which is larger than $\pi r^2$. Therefore, an exposure area of each of the first pattern 257a in the reticle 240 according to example embodiments may be about 1.1 times greater than an exposure area of a pattern in a reticle having a circular shape. When the exposure process is performed using the reticle 240, the amount of light applied to the photoresist layer is increased. Thus, the photoresist pattern may have an accurate edge contour.

Accordingly, the photoresist pattern formed using the reticle 240 may have improved image log slope (ILS) and improved normalized image log slope (NILS). Therefore, uniformity of the photoresist pattern may be improved. Also, an effective dose of light applied to the photoresist layer may be increased.

As described above, the shortest distance d1 between the first patterns 257a closest to each other in the reticle 240 may be the same as the shortest distance between the target holes 300. Therefore, the exposure area may be increased while maintaining the shortest distance d1 between the first patterns 257a to be the same as a shortest distance between first patterns having the circular shape.

After performing an exposure process using the reticle 240, the photoresist layer may be developed to form the photoresist pattern including holes. The holes may be the same as the target holes 300 shown in FIG. 2.

By changing the image pattern (or, the first pattern) included in the reticle, a hole array pattern having various arrangements may be formed. Hereinafter, an image pattern of a reticle suitable for forming a target hole array pattern having a different arrangement, e.g., different orientation, will be described with reference to FIGS. 8-10.

Figure 8:
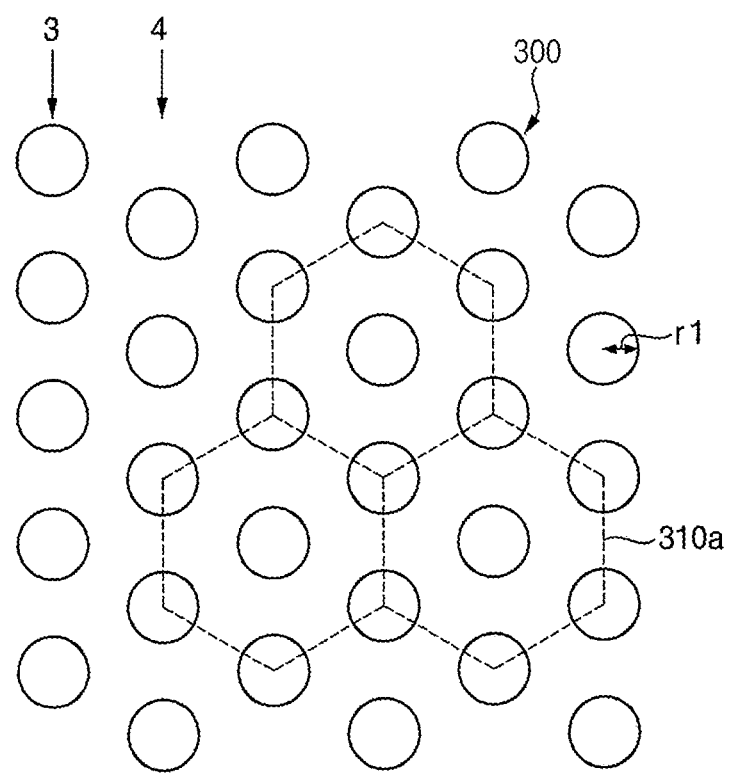
FIG. 8 is a plan view illustrating an arrangement of a target hole array pattern in accordance with example embodiments.
Figure 9:
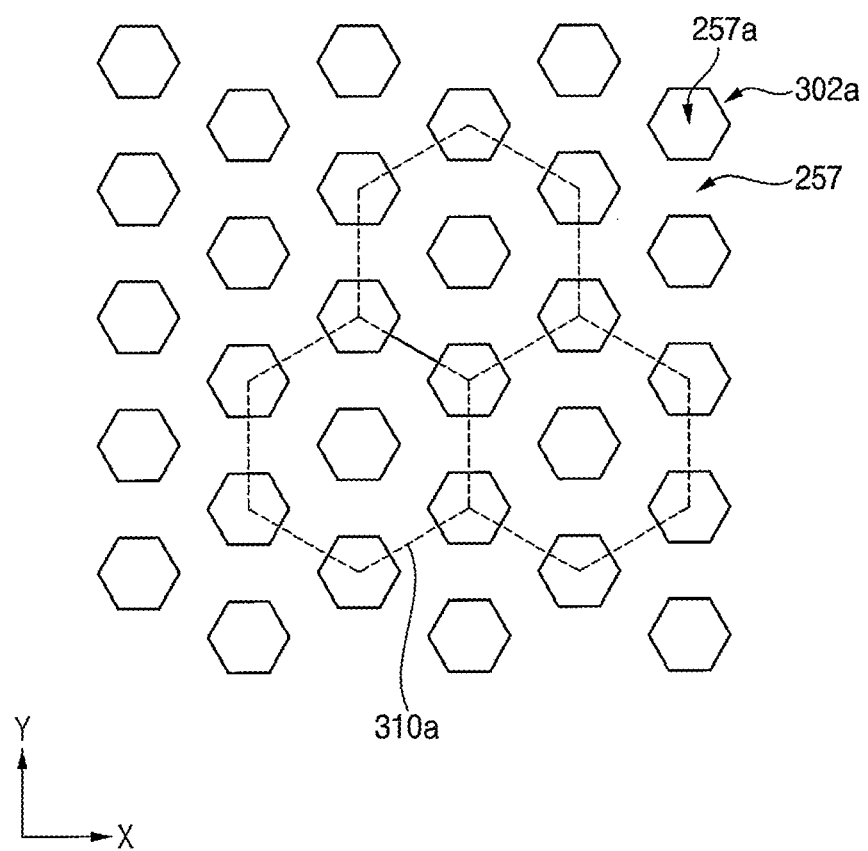
FIG. 9 is an enlarged plan view illustrating an image pattern of a reticle suitable for forming the target hole array pattern shown in FIG. 8.
Figure 10:
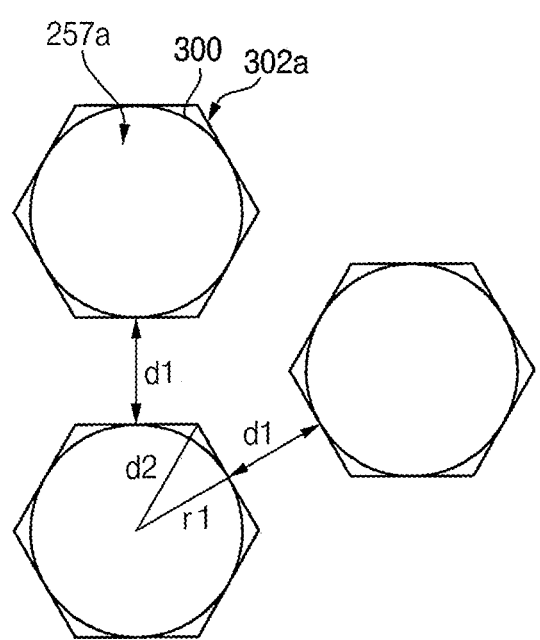
FIG. 10 is an enlarged plan view illustrating first patterns in the reticle and corresponding target holes.

FIG. 8 is a plan view illustrating an arrangement of a target hole array pattern in accordance with example embodiments. FIG. 9 is an enlarged plan view illustrating an image pattern of a reticle suitable for forming the target hole array pattern shown in FIG. 8. FIG. 10 is an enlarged plan view illustrating first patterns in the reticle and corresponding target holes.

Referring to FIG. 8, a mold layer may be formed on a substrate, and the mold layer may include regularly arranged holes 300. The holes 300 may have a honeycomb arrangement which is arranged at each vertex of a first regular hexagon 310a and an inner center of the first regular hexagon 310a.

In example embodiments, in the honeycomb arrangement of the holes 300, the first regular hexagon 310a may be rotated by 90 degrees from the first regular hexagon shown in FIG. 1. That is, the first regular hexagon 310a may have a shape in which upper and lower portions protrude, e.g., convex portions, and a shape in which side portions have vertical straight lines, e.g., each side portion in a straight line in its entirety.

The holes 300 may be arranged in the second direction Y. In addition, each of the portions arranged in the portion extending in the second direction Y may be referred to as a column, and a plurality of columns may be arranged in the first direction X, e.g., the columns may be spaced apart from each other in the first direction X. The holes disposed in the first column 3 and the holes disposed in the second column 4 adjacent to the first column 3 may be arranged from each other in a zigzag fashion, e.g., the first column 3 and the second column 4 may extend in the second direction Y and may be offset from each other.

Referring to FIG. 9, each of the first patterns 257a included in the reticle may have a shape of a second regular hexagon 302a, in a plan view. The second regular hexagon 302a of each of the first patterns 257a may have the same arrangement as that of the first regular hexagon 310a, which is the honeycomb arrangement of the target hole array pattern, rotated by 90 degrees. That is, in the reticle, the second regular hexagon 302a may have a shape in which upper and lower portions have horizontal straight lines, and a shape in which side portions protrude.

Referring to FIG. 10, the second regular hexagon 302a may circumscribe the target holes 300 of the target hole array pattern. Therefore, an exposure area of each of the first patterns 257a in the reticle according to example embodiments may be about 1.1 times greater than an exposure area of each of first patterns having a circular shape in a comparative reticle. Accordingly, a photoresist pattern formed using the reticle according to example embodiments may have improved image log slope (ILS) and improved normalized image log slope (NILS). In addition, an effective dose of light applied to the photoresist layer may be increased.

Also, a shortest distance d1 between the first patterns 257a closest to each other in the reticle may be the same as a shortest distance between the target holes 300. Therefore, the exposure area may be increased while maintaining the shortest distance d1 between each of the first patterns 257a to be the same as a shortest distance between the first patterns having the circular shape.

After performing an exposure process using the reticle 240, the photoresist layer may be developed to form the photoresist pattern including holes. The holes may be the same as the target holes 300 shown in FIG. 8.

Figure 11:
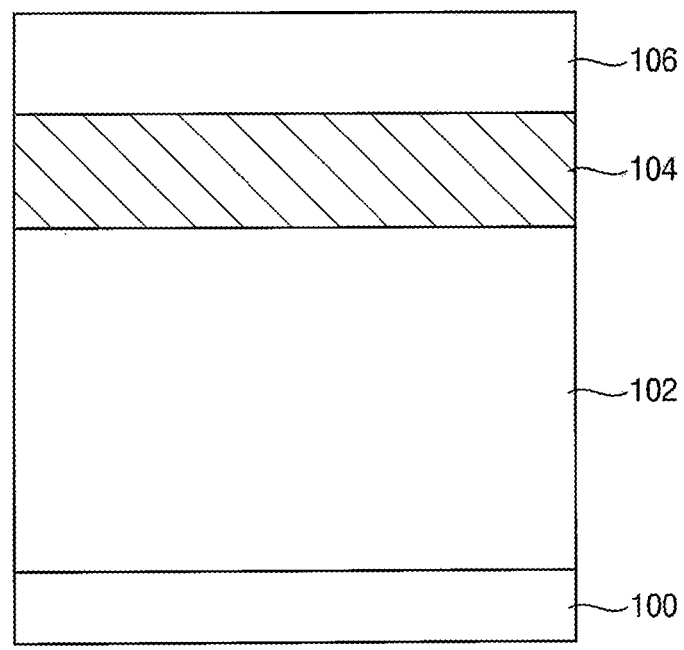
FIGS. 11 to 13 are cross-sectional views illustrating stages in a method of forming a target hole array pattern.
Figure 12:
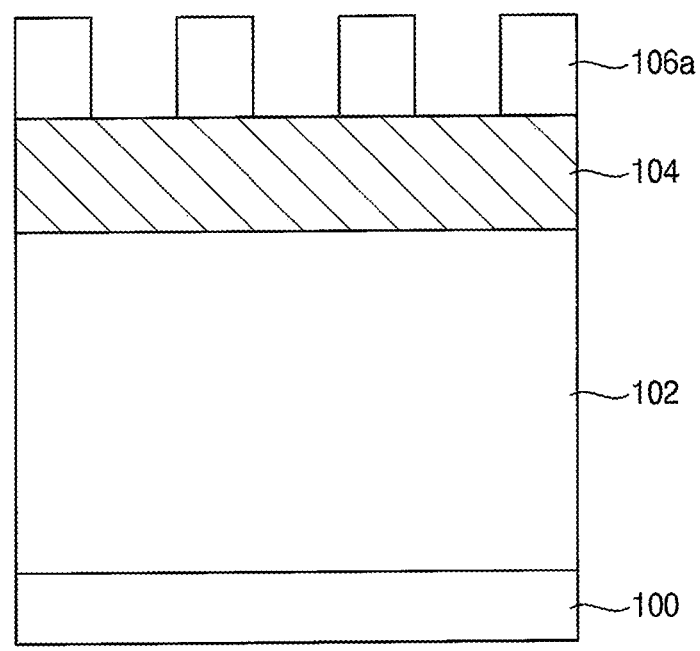
Figure 13:
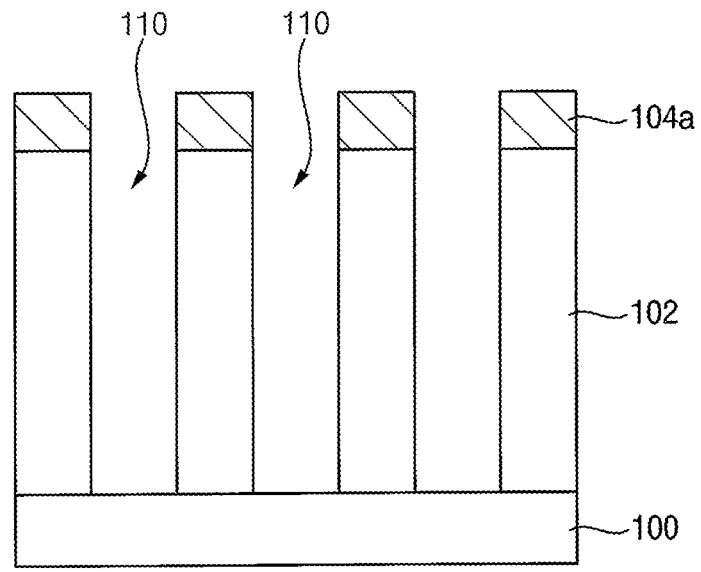

Hereinafter, a method for forming the target hole array pattern will be described with reference to FIGS. 11 to 13. FIGS. 11 to 13 are cross-sectional views illustrating stages in a method of forming a target hole array pattern.

Referring to FIG. 11, a mold layer 102 may be formed on a substrate 100. The mold layer 102 may include an insulation material. The mold layer 102 may include, e.g., silicon oxide or silicon nitride.

A hard mask layer 104 may be formed on the mold layer 102. A photoresist layer 106 may be coated on the hard mask layer 104.

Referring to FIG. 12, a photoresist pattern 106a may be formed by performing an exposure process and a developing process on the photoresist layer 106. The photoresist pattern 106a may have substantially the same arrangement as the arrangement of the target hole array pattern.

In detail, the substrate 100 on which the photoresist layer 106 is formed may be loaded into the exposure apparatus 200 (refer to FIG. 1), e.g., the substrate 100 may correspond to the substrate W in FIG. 1. The reticle 240 may be disposed over the substrate 100.

In example embodiments, the reticle 240 illustrated with reference to FIGS. 3 to 7 may be used in the exposure process. In some example embodiments, the reticle illustrated with reference to FIGS. 8 to 10 may be used in the exposure process.

In example embodiments, the light applied to the reticle 240 may be extreme ultraviolet (EUV) light. However, the light is not limited to EUV light, e.g., the light may have a wavelength of g-line (436 nm), i-line (365 nm), KrF (248 nm), or ArF (193 nm).

After performing the exposure process using the reticle 240, a developing process may be performed to form the photoresist pattern 106a including holes. The photoresist pattern 106a may have improved image log slope (ILS) and improved normalized image log slope (NILS). Also, the effective dose of light may be increased.

Referring to FIG. 13, the hard mask layer 104 may be etched using the photoresist pattern 106a as an etching mask to form a first hard mask 104a. After that, the photoresist pattern 106a may be removed.

The mold layer 102 may be etched using the first hard mask 104a as an etch mask to form a target hole array pattern 110 in the mold layer 102, e.g., the holes 300 in FIG. 2. The mold layer 102 may be etched by an anisotropic etching process.

An arrangement of the target hole array pattern 110 may be changed depending on an image pattern of a reticle. In example embodiments, the target hole array pattern 110 may have the same arrangement as described with reference to FIG. 2. In some example embodiments, the target hole array pattern 110 may have the same arrangement as described with reference to FIG. 8. In a plan view, each of holes of the target hole array pattern 110 may have a circular shape having a first radius r1.

As described, by optimizing the shape of the first pattern included in the reticle, the photoresist pattern 106a may have improved image log slope (ILS) and normalized image log slope (NILS). In addition, the mold layer may be patterned using the photoresist pattern 106a to form the target hole array pattern 110 having a target width and space. Further, the target hole array pattern 110 having a regular and dense honeycomb arrangement may be formed by the above process.

Figure 14:
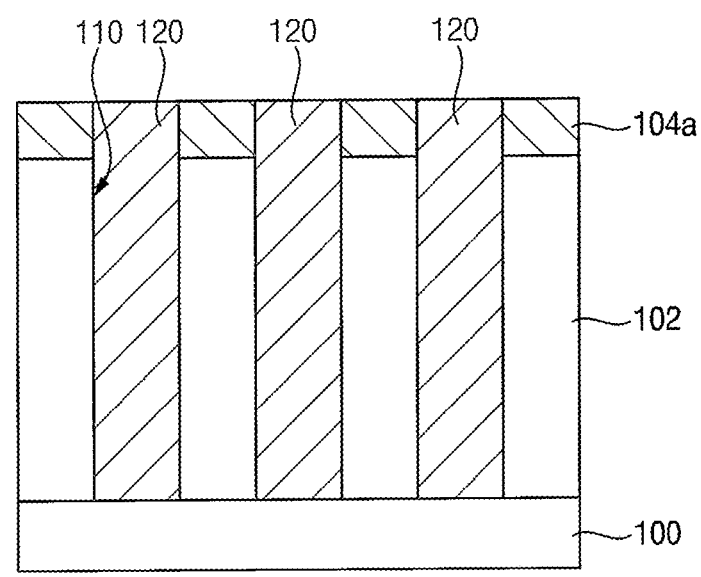
FIGS. 14 and 15 are cross-sectional views illustrating stages in a method for forming pillar-shaped patterns.
Figure 15:
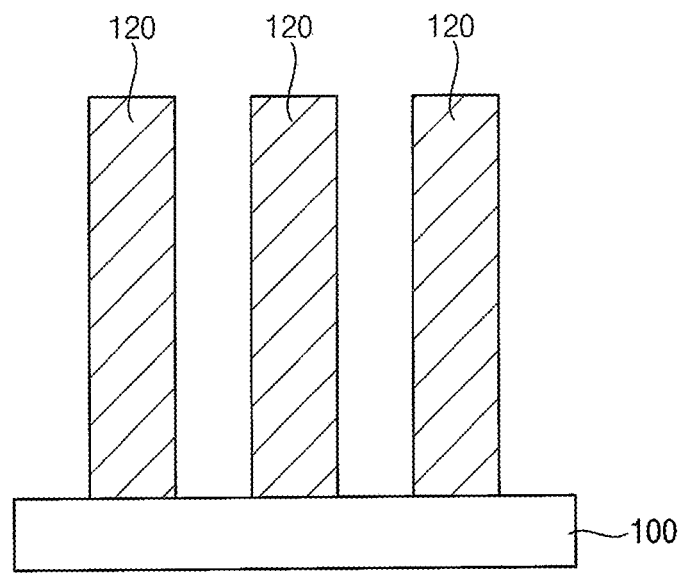

Hereinafter, methods for forming a pillar-shaped pattern and a cylindrical pattern using the target hole array pattern 110 of FIG. 13 are described, respectively, with reference to FIGS. 14 and 15. FIGS. 14 and 15 are cross-sectional views illustrating stages in a method for forming pillar-shaped patterns. The pillar-shaped patterns may be formed by performing additional processes after performing the processes illustrated with reference to FIGS. 11 to 13.

Referring to FIG. 14, first, the processes illustrated with reference to FIGS. 11 to 13 may be performed to form the target hole array pattern 110 in the mold layer 102. Thereafter, a conductive layer may be formed on the first hard mask 104a to fill holes of the target hole array pattern 110. The conductive layer may include, e.g., a metal. The conductive layer may be planarized until an upper surface of the first hard mask 104a is exposed to form a conductive pattern 120 having a pillar shape in each of the holes. The planarization process may include, e.g., a chemical mechanical polishing process or an etch-back process.

Referring to FIG. 15, the mold layer 102 and the first hard mask 104a may be removed. Thus, surfaces of the conductive patterns 120 may be exposed. For example, the mold layer 102 and the first hard mask 104a may be removed by a wet etching process.

The conductive patterns 120 may have the arrangement shown in FIG. 2 or the arrangement shown in FIG. 8 according to the arrangement of the first pattern in the reticle for forming the target hole array pattern.

The conductive patterns 120 having the pillar shape and a regular and dense honeycomb arrangement may be formed by the above processes. The conductive patterns 120 may be patterned using the photoresist pattern 106a having improved image log slope (ILS) and normalized image log slope (NILS). Thus, a diameter and a shape of each of the conductive patterns 120 and a distance between the conductive patterns 120 may have target values, and the conductive patterns 120 may have high uniformity.

FIGS. 16 to 19 are cross-sectional views illustrating a method for forming pillar-shaped patterns.

Figure 16:
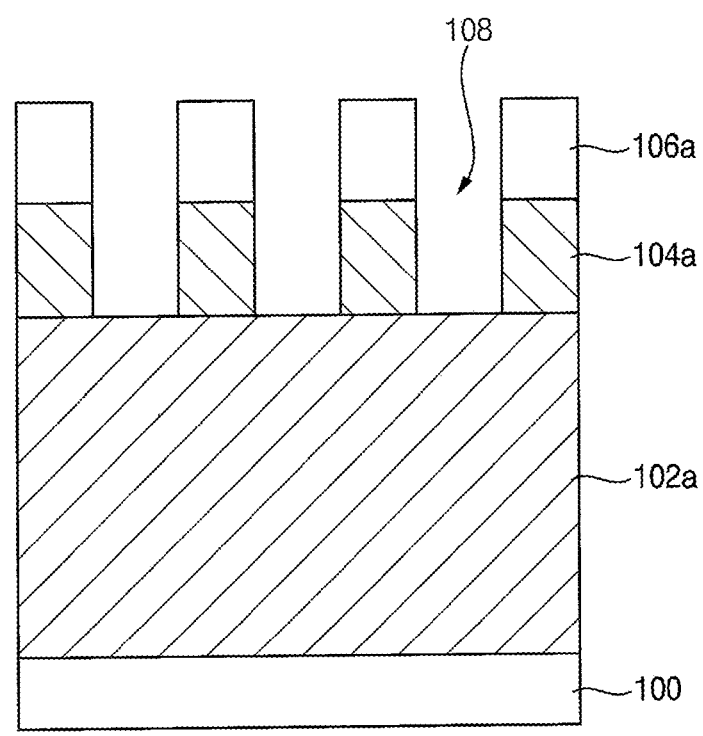
FIGS. 16 to 19 are cross-sectional views illustrating stages in a method for forming pillar-shaped patterns.

Referring to FIG. 16, an etch target layer 102a may be formed on the substrate 100. The etch target layer 102a may be formed of a single layer or a plurality of stacked layers. For example, the etch target layer 102a may include a conductive layer or an magnetic tunnel junction (MTJ) structure layer.

A hard mask layer may be formed on the etch target layer 102a. A photoresist layer may be coated on the hard mask layer.

Thereafter, the processes illustrated with reference to FIGS. 12 and 13 may be performed. That is, the photoresist pattern 106a may be formed by performing an exposure process and a developing process on the photoresist layer, and the hard mask layer 104 may be etched using the photoresist pattern 106a as an etching mask to form the first hard mask 104a. The first hard mask 104a may include holes 108 having a honeycomb arrangement.

Figure 17:
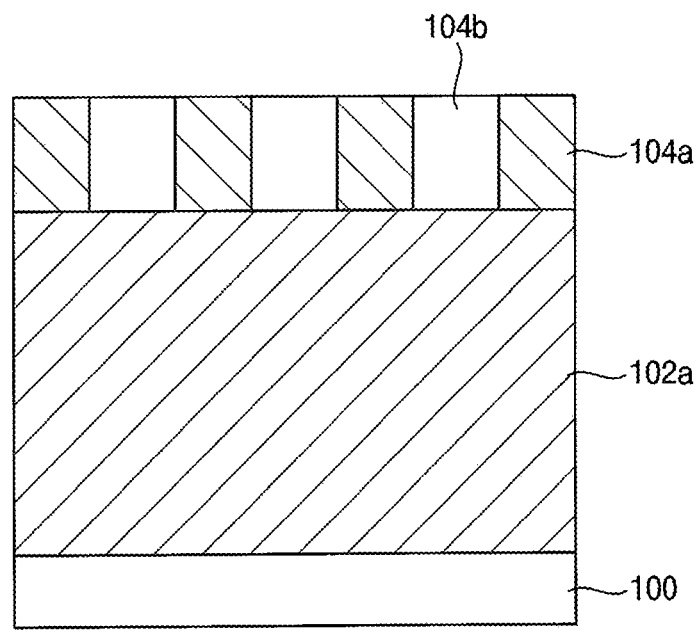

Referring to FIG. 17, the photoresist pattern 106a may be removed. A second hard mask layer may be formed on the first hard mask 104a and the etch target layer 102a to fill the holes 108 between the first hard mask 104a. The second hard mask layer may include a material having an etch selectivity with respect to the first hard mask 104a. In addition, the second hard mask layer may include a material having an etch selectivity with respect to the etch target layer 102a.

The second hard mask layer may be planarized until an upper surface of the first hard mask 104a is exposed to form a second hard mask 104b. The second hard mask 104b may be formed to fill the holes 108. The second hard mask 104b may have a honeycomb arrangement.

Figure 18:
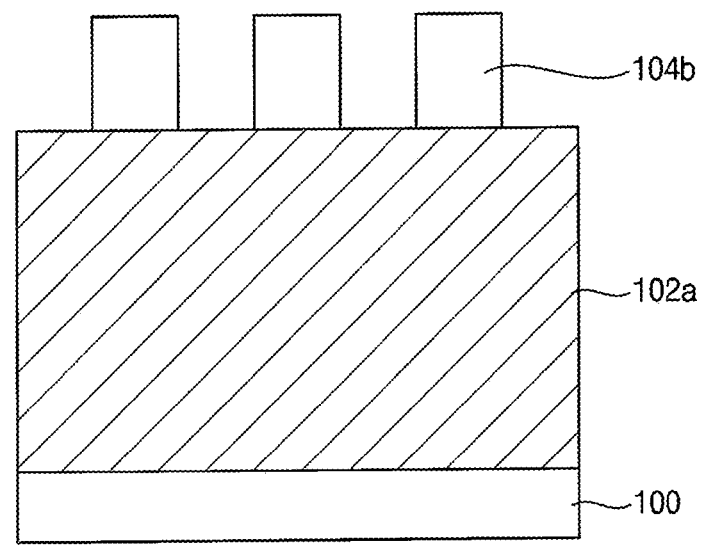

Referring to FIG. 18, the first hard mask 104a may be removed. Thus, the etch target layer 102a may be exposed between the second hard masks 104b. In example embodiments, the first hard mask 104a may be removed by a wet etching process.

Figure 19:
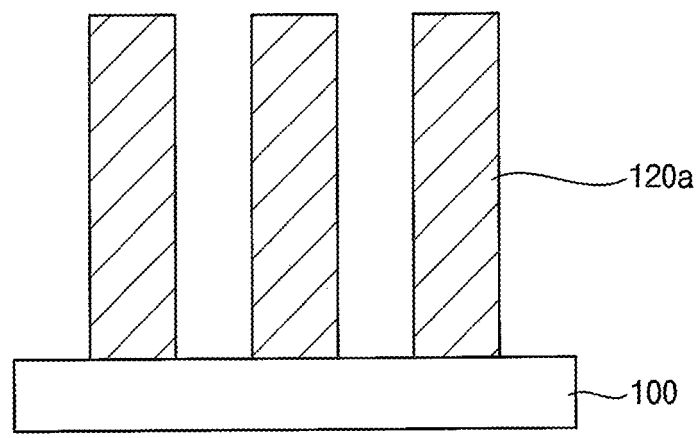

Referring to FIG. 19, the etch target layer 102a may be etched to form pillar-shaped patterns 120a. The pillar-shaped patterns 120a may have the arrangement shown in FIG. 2 or the arrangement shown in FIG. 8 according to the arrangement of the first patterns in the reticle for forming the target hole array pattern. The pillar-shaped patterns 120a having a regular and dense honeycomb arrangement may be formed by the above process.

Figure 20:
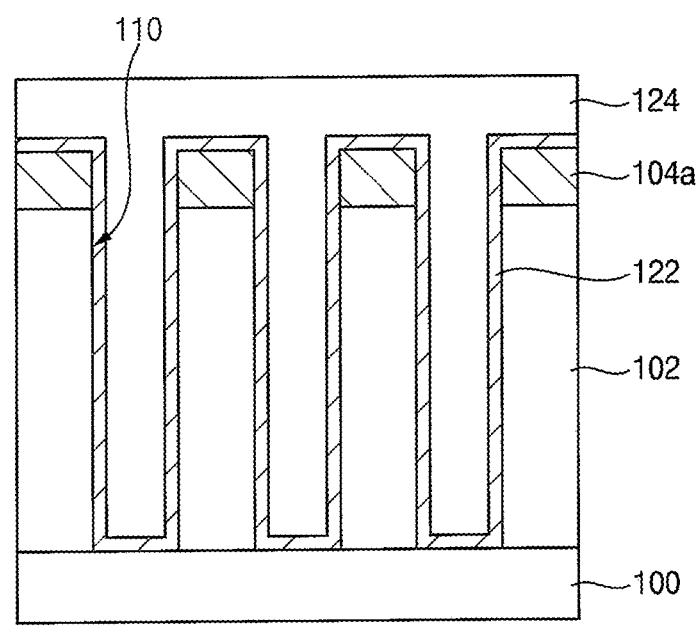
FIGS. 20 to 22 are cross-sectional views illustrating stages in a method for forming cylindrical patterns.
Figure 21:
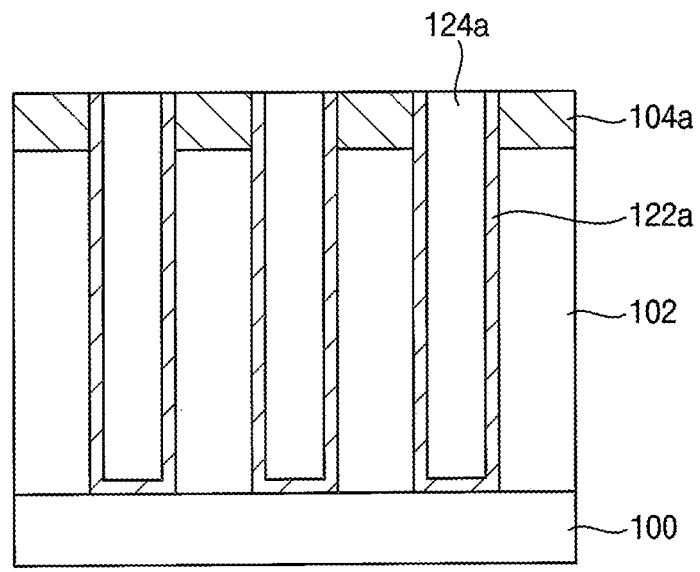
Figure 22:
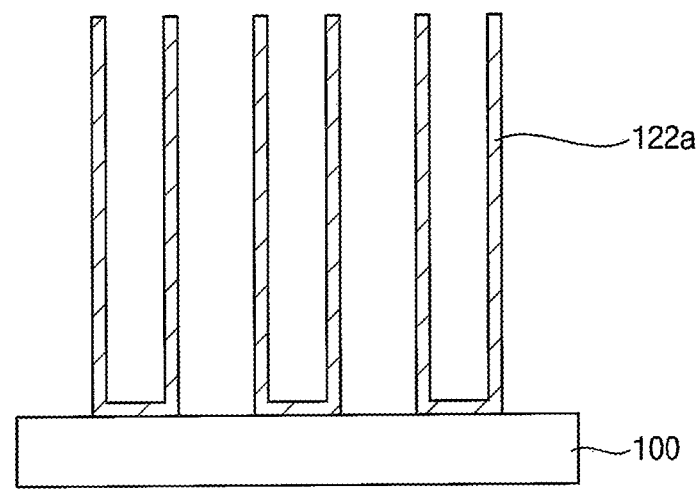

FIGS. 20 to 22 are cross-sectional views illustrating stages in a method for forming cylindrical patterns. The cylindrical patterns may be formed by performing additional processes after performing the processes illustrated with reference to FIGS. 11 to 13.

Referring to FIG. 20, first, the process illustrated with reference to FIGS. 11 to 13 may be performed to form the target hole array pattern 110 in the mold layer 102. Thereafter, a conductive layer 122 may be conformally formed on surfaces of each of holes of the target hole array pattern 110 and the mold layer 102. The conductive layer 122 may include, e.g., a metal.

A sacrificial layer 124 may be formed on the conductive layer 122 to fill the holes. In example embodiments, the sacrificial layer 124 may include a material that may be removed together in a process of removing the mold layer 102. For example, the sacrificial layer 124 may include a same material as a material of the mold layer 102.

Referring to FIG. 21, the sacrificial layer 124 and the conductive layer 122 may be planarized until an upper surface of the first hard mask 104a is exposed to form conductive patterns 122a having a cylindrical shape and a sacrificial pattern 124a in each of the holes.

Referring to FIG. 22, the mold layer 102 and the sacrificial pattern 124a may be removed. Thus, surfaces of the conductive patterns 122a may be exposed. In example embodiments, the mold layer 102 and the sacrificial pattern 124a may be removed by a wet etching process. The conductive patterns 122a may have the arrangement shown in FIG. 2 or the arrangement shown in FIG. 8 according to the arrangement of the first patterns in the reticle for forming the target hole array pattern.

The conductive patterns 122a having a cylindrical shape and a regular and dense honeycomb arrangement may be formed by the above process. As such, processes for forming the target hole array pattern may be used to form holes or patterns having regular and dense honeycomb arrangement in a semiconductor device. For example, the processes for forming the target hole array pattern may be used in processes for forming a lower electrode of a dynamic random access memory (DRAM) device. As another example, the processes for forming the target hole array pattern may also be used in the processes for forming an MTJ structure of an a magnetoresistive random access memory (MRAM) device.

Hereinafter, a method of manufacturing a DRAM device including lower electrodes having a honeycomb arrangement is described with reference to FIGS. 23 to 28. FIGS. 23 to 28 are plan views and cross-sectional views illustrating stages in the method of manufacturing the DRAM device in accordance with example embodiments. Each of the cross-sectional views corresponds to a cross-section along line II-II' of FIG. 23.

Figure 23:
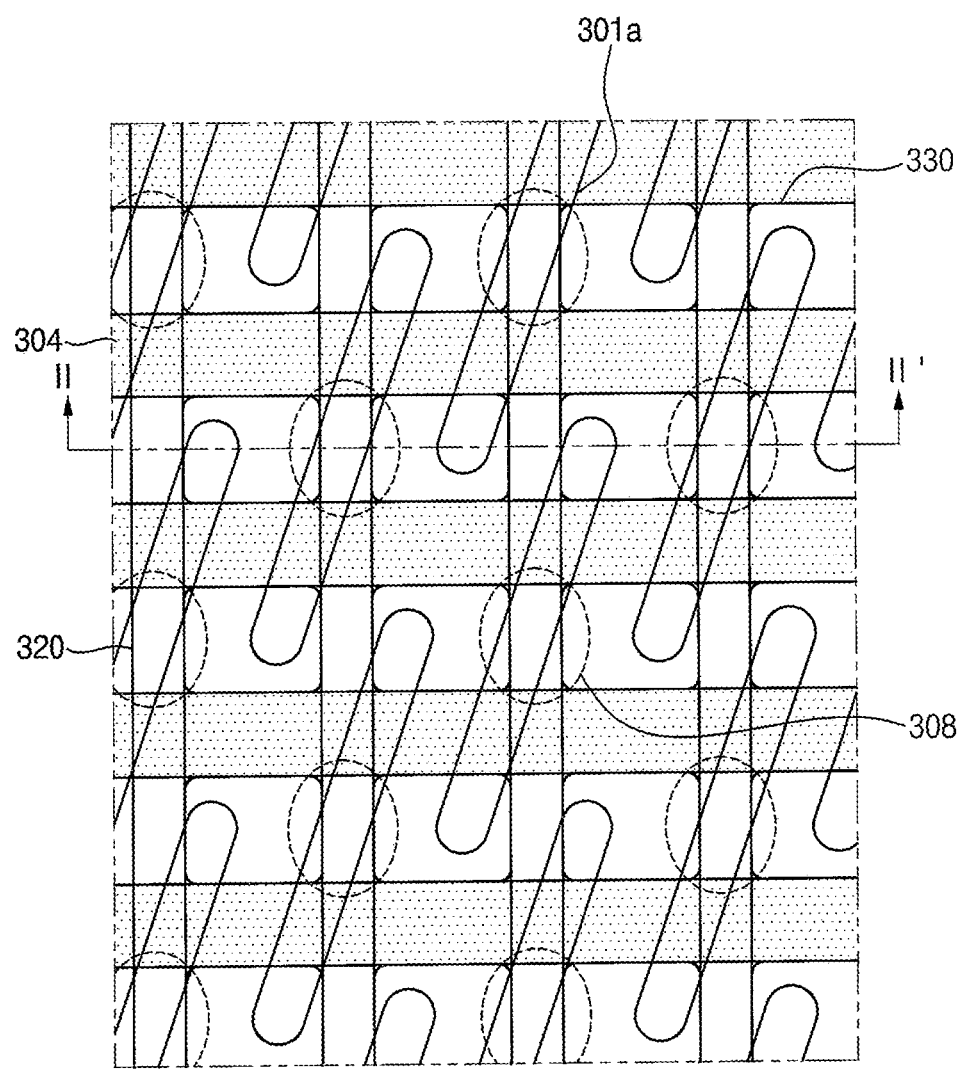
FIGS. 23 to 28 are plan views and cross-sectional views illustrating stages in a method of manufacturing a DRAM device in accordance with example embodiments.
Figure 24:
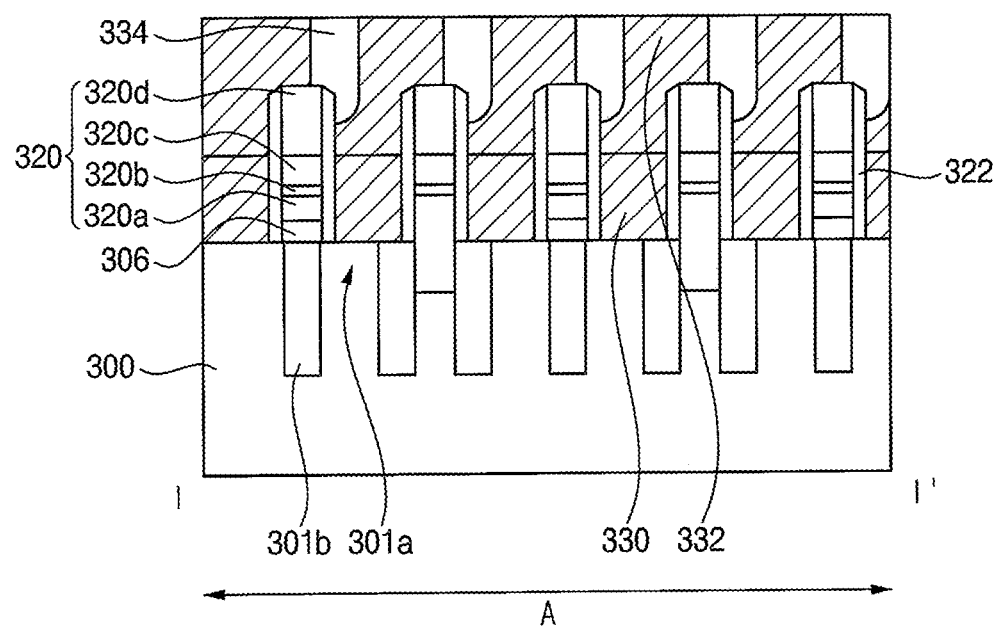

Referring to FIGS. 23 and 24, a device isolation layer 301b for defining an active region 301a may be formed on the substrate 100. A lower structure may be formed on the substrate 100. The lower structure may include, e.g., a transistor, a bit line structure 320, a contact plug 330, a landing pad 332, and an upper insulation pattern 334. Upper surfaces of the landing pad 332 and the upper insulation pattern 334 may be, e.g., coplanar and, exposed at an uppermost surface of the lower structure.

In detail, the device isolation layer 301b may be formed by performing a trench device isolation process on the substrate 100. Transistors may be formed on the substrate 100. Each of the transistors may include a gate structure 304 and first and second impurity regions. In example embodiments, the transistor may be a buried transistor. In example embodiments, a portion of the substrate 100 may be etched to form a gate trench, and the gate structure may be formed in the gate trench. The gate structure 304 may include, e.g., a gate insulation layer, a gate electrode, and a first capping pattern stacked.

Insulation layer patterns 306 may be formed on the substrate 100. A recess 308 may be formed at a portion of the substrate 100 between the insulation layer patterns 306. A top surface of the first impurity region may be exposed at a bottom surface of the recess 308.

The bit line structures 320 may be formed on the insulation layer patterns 306 and the recesses 308. Each of the bit line structures 320 may include a conductive pattern 320a, a barrier metal pattern 320b, a metal pattern 320c, and a second capping pattern 320d stacked. In example embodiments, a spacer 322 may be formed on sidewalls of the bit line structure 320.

A first insulating interlayer may be formed on the substrate 100 to cover the bit line structures 320. A portion of the first insulating interlayer between the bit line structures 320 may be etched to form a lower contact hole exposing the second impurity region of the substrate 100. The contact plug 330 and the landing pad 332 may be formed to fill the lower contact hole. The upper insulation pattern 334 may be formed between the landing pads 332.

In example embodiments, the upper surfaces of the landing pad 332 and the upper insulation pattern 334 may be substantially coplanar with each other. The upper surfaces of the landing pad 332 and the upper insulation pattern 334 may be substantially flat.

Figure 25:
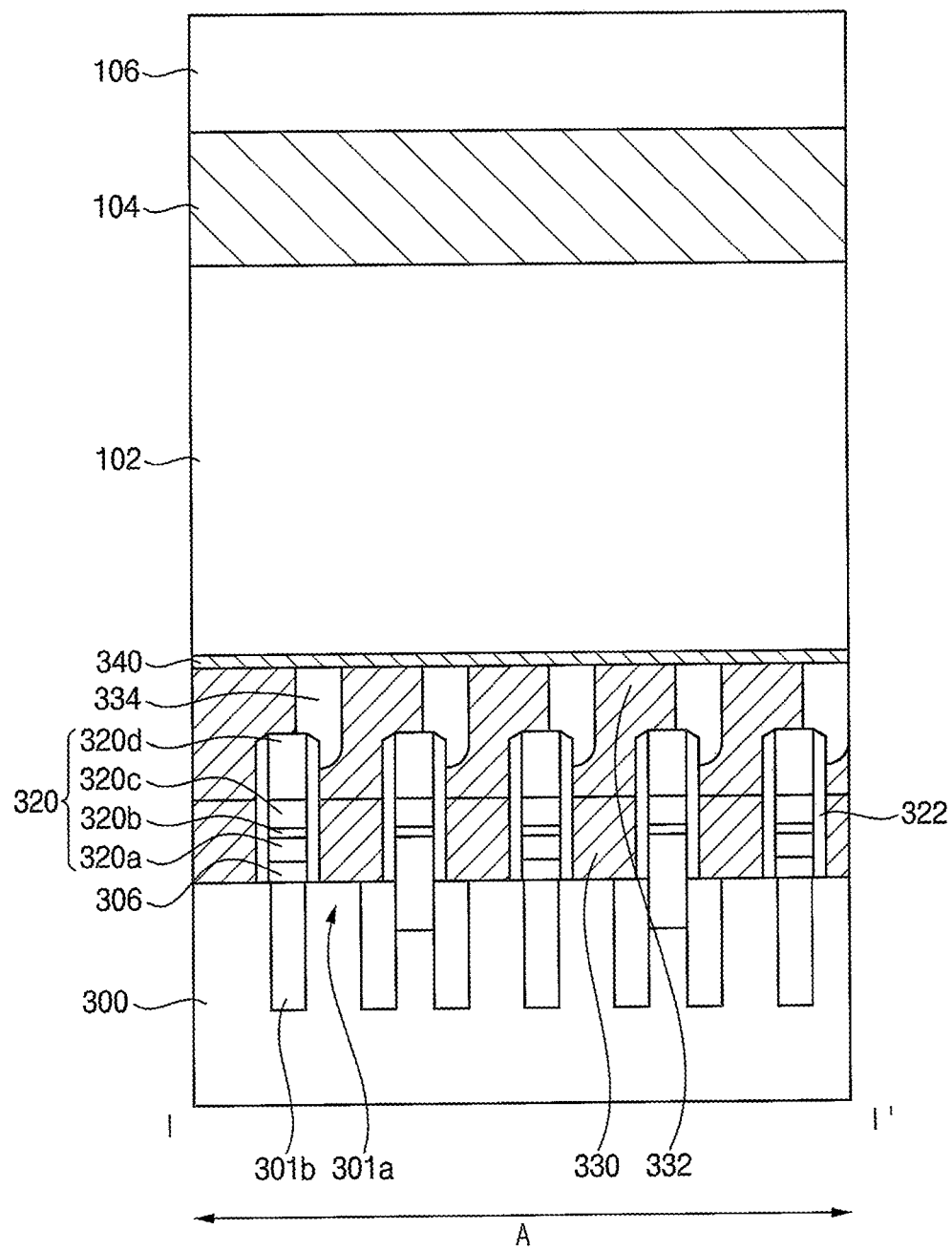

Referring to FIG. 25, an etch stop layer 340 may be formed on the first insulating interlayer, the landing pad 332, and the upper insulation pattern 334. The etch stop layer 340 may include, e.g., silicon nitride, silicon oxynitride, or the like.

The mold layer 102 may be formed on the etch stop layer 340. The hard mask layer 104 may be formed on the mold layer 102. The photoresist layer 106 may be coated on the hard mask layer 104.

Figure 26:
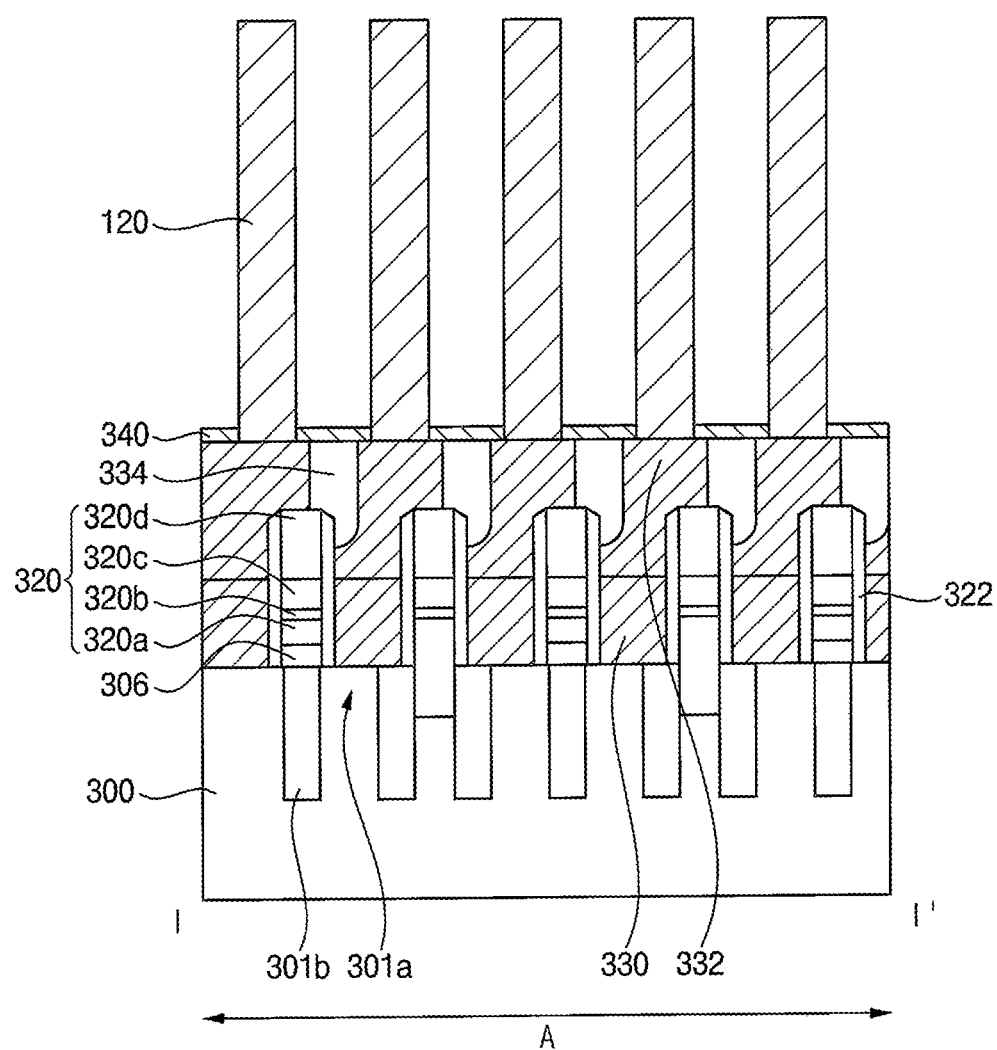
Figure 27:
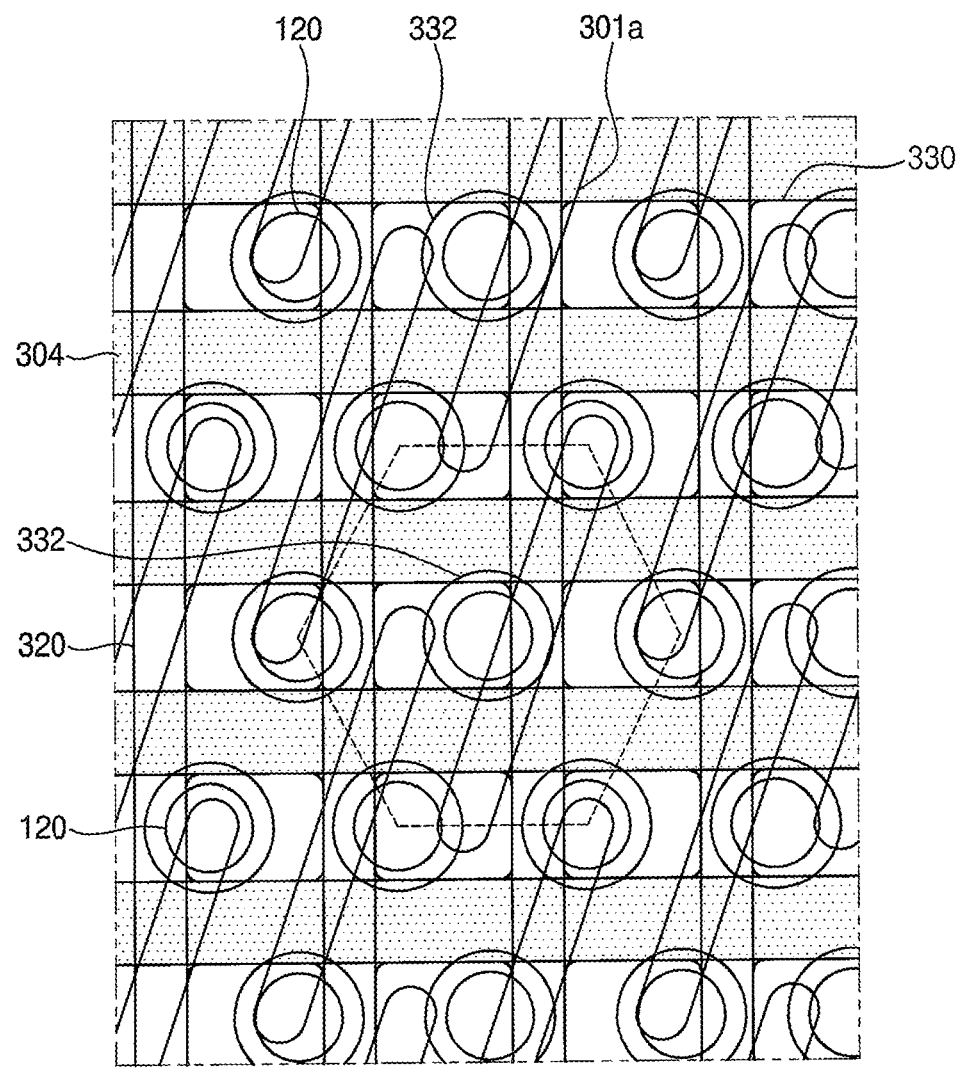

Referring to FIGS. 26 and 27, the same processes illustrated with reference to FIGS. 12 to 15 may be performed. Thus, a hole pattern array may be formed in the mold layer 102, and the conductive pattern 120 may be formed in each of holes of the hole pattern array. The conductive pattern 120 may serve as a lower electrode of the capacitor. Hereinafter, the conductive pattern 120 is referred to as a lower electrode.

The lower electrode 120 may have a pillar shape. The lower electrode 120 may include a metal, e.g., Ti, W, Ni, or Co, or a metal nitride, e.g., TiN, TiSiN, TiAlN, TaN, TaSiN, or WN.

The lower electrodes 120 may have the honeycomb arrangement. A diameter and shape of each of the lower electrodes 120 and a distance between the lower electrodes 120 may have target values. In some example embodiments, a cylindrical lower electrode may be formed by performing the same processes illustrated with reference to FIGS. 20 to 22.

Figure 28:
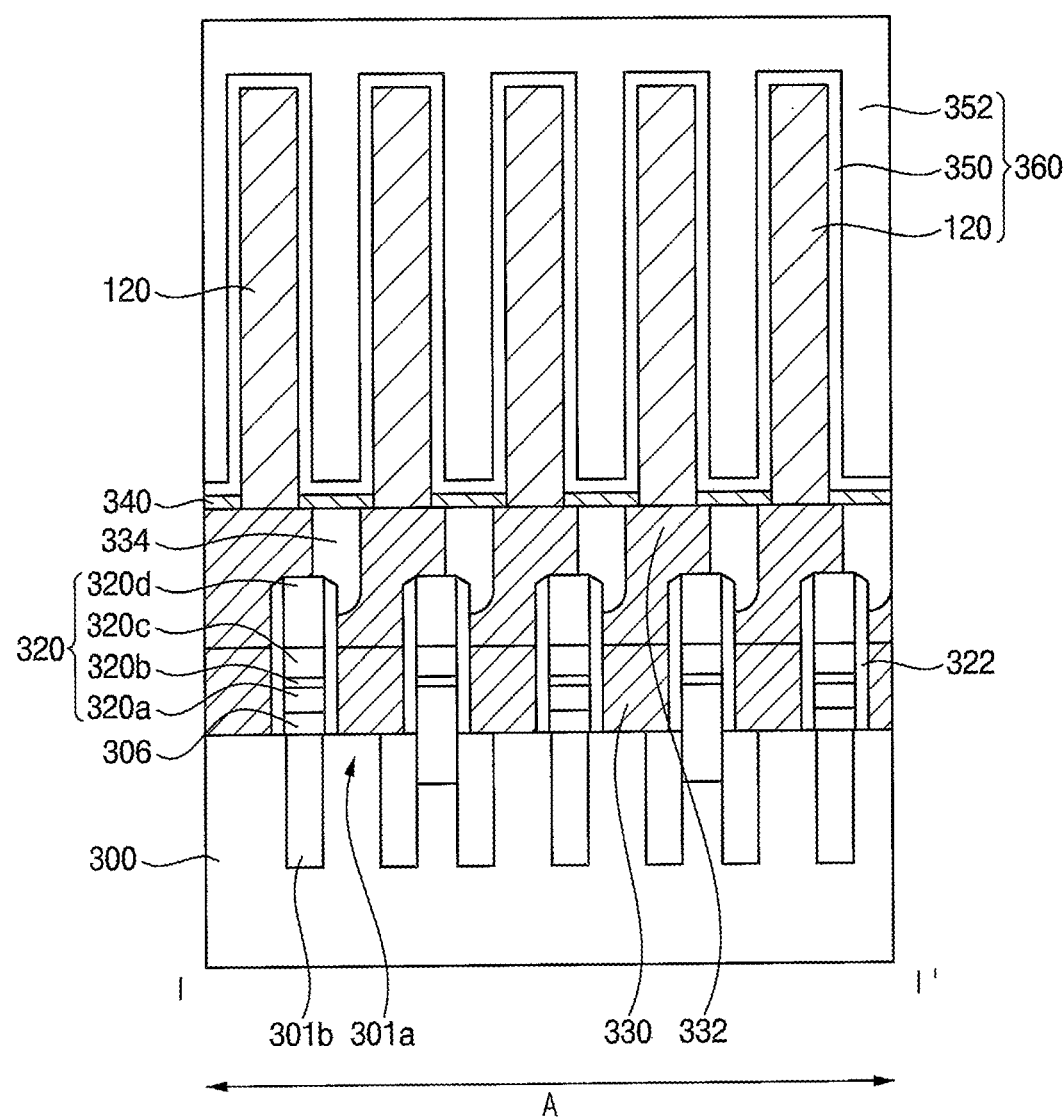

Referring to FIG. 28, a dielectric layer 350 may be conformally formed on surfaces of the lower electrode 120 and the etch stop layer 340. The dielectric layer 350 may include a high-k layer. In example embodiments, the high-k layer may include, e.g., a hafnium oxide layer ($HfO_2$), a zirconium oxide layer ($ZrO_2$), an aluminum oxide layer ($Al_2O_3$), or a lanthanum oxide layer ($La_2O_5$).

An upper electrode layer 352 may be formed on the dielectric layer 350. In example embodiments, the upper electrode layer 352 may include a metal nitride, e.g., TiN, TiSiN, TiAlN, TaN, TaSiN, or WN.

Therefore, a capacitor 360 including the lower electrode 120, the dielectric layer 350, and the upper electrode layer 352 may be formed. A DRAM device may be manufactured by the above process. The lower electrodes 120 included in the DRAM device may have a regular and dense honeycomb arrangement.

By way of summation and review, example embodiments provide a reticle suitable for forming a hole array pattern. Further, example embodiments provide a method for forming a hole array pattern via the reticle. As such, the reticle according to example embodiments may be used in processes for forming various patterns of a semiconductor device.

That is, in example embodiments, the reticle may have a shape that allows the amount of light reflected therethrough to increase, so that an amount of light applied to the photoresist layer may increase during an exposure process. Thus, ILS and NILS of the photoresist pattern may be improved. Also, dense patterns having honeycomb arrangement may be formed using the photoresist pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reticle, comprising:
   a mask substrate;
   a reflective layer on the mask substrate; and
   a mask pattern on the reflective layer, the mask pattern including:
     image patterns to absorb light, and
     first patterns between the image patterns, the first patterns being openings, the first patterns having a honeycomb arrangement, in a plan view, such that seven of the first patterns are arranged at corresponding vertices and a center of a first regular hexagon, and each of the first patterns having a shape of a second regular hexagon that is rotated by 90 degrees relative to the first regular hexagon, the second regular hexagon having straight edges that meet at vertices,
   wherein:
   the first regular hexagon has a shape in which upper and lower portions are horizontal straight edges extending in a horizontal direction from a plan view, and side portions protrude outwardly relative to the upper and lower portions, and
   the second regular hexagon has a shape in which upper and lower portions protrude outwardly, and side portions are vertical straight edges extending between two vertices in a vertical direction from a plan view, the vertical direction perpendicular to the horizontal direction.

2. The reticle as claimed in claim 1, wherein the first patterns are arranged in rows that extend in the horizontal direction, adjacent ones of the rows being offset with respect to each other in a zigzag pattern along the vertical direction.

3. The reticle as claimed in claim 1, wherein each second regular hexagon circumscribes a respective circle formed so that the sides of the second regular hexagon are all tangent to the circle, and the circle corresponds to a shape of light reflected off of the reflective layer after passing through the second regular hexagon.

4. The reticle as claimed in claim 3, wherein a shortest distance between each second regular hexagon and an adjacent second regular hexagons is the same as a shortest distance between adjacent circles of the respective circles.

5. The reticle as claimed in claim 3, wherein for each second regular hexagon, a distance from a center of the second regular hexagon to a vertex of the second regular hexagon is greater than a radius of each circle of the respective circles.

6. The reticle as claimed in claim 1, wherein the mask substrate includes an image region and a black region surrounding the image region, the image patterns and the first patterns of the mask pattern being on the image region.

7. A reticle, comprising:
   a mask substrate including an image region and a black region surrounding the image region;
   a metal layer on a bottom surface of the mask substrate;
   a reflective layer on a top surface of the mask substrate; and
   a mask pattern on the reflective layer, the mask pattern including:
     image patterns on the image region of the mask substrate, the image patterns to absorb light,
     first patterns between the image patterns, the first patterns being openings, the first patterns having a honeycomb arrangement, in a plan view, such that seven of the first patterns are arranged at corresponding vertices and a center of a first regular hexagon, and each of the first patterns having a shape of a second regular hexagon including straight edges that meet at vertices and circumscribes a respective circle formed so that the sides of the second regular hexagon are all tangent to the circle, and
     a black pattern on the black region of the mask substrate,
   wherein a shortest distance between each second regular hexagon and any adjacent second regular hexagon is the same as a shortest distance between the respective circles.

8. The reticle as claimed in claim 7, wherein each second regular hexagon is rotated by 90 degrees relative to the first regular hexagon.

9. The reticle as claimed in claim 7, wherein the first patterns are arranged in rows that extend in a first direction parallel to a top surface of the mask substrate, adjacent ones of the rows being offset with respect to each other in a zigzag pattern in a second direction parallel to the top surface of the mask substrate and perpendicular to the first direction.

10. The reticle as claimed in claim 7, wherein for each second regular hexagon a distance from a center of the second regular hexagon to a vertex of the second regular hexagon is greater than a radius the respective circle of the.

* * * * *